US010276494B2

United States Patent
Kaemmer et al.

(10) Patent No.: US 10,276,494 B2
(45) Date of Patent: Apr. 30, 2019

(54) ONE TIME PROGRAMMABLE MEMORY CELL AND MEMORY ARRAY

(71) Applicant: Infineon Technologies AG, Neubiberg (DE)

(72) Inventors: Kerstin Kaemmer, Radebeul (DE); Martin Bartels, Dresden (DE); Henning Feick, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/654,526

(22) Filed: Jul. 19, 2017

(65) Prior Publication Data

US 2018/0061756 A1    Mar. 1, 2018

(30) Foreign Application Priority Data

Aug. 26, 2016   (DE) .................. 10 2016 115 939

(51) Int. Cl.
| | |
|---|---|
| *G11C 17/16* | (2006.01) |
| *H01L 23/525* | (2006.01) |
| *H01L 27/112* | (2006.01) |
| *H01L 27/102* | (2006.01) |
| *G11C 17/18* | (2006.01) |

(52) U.S. Cl.
CPC .......... *H01L 23/5252* (2013.01); *G11C 17/16* (2013.01); *H01L 27/1026* (2013.01); *H01L 27/11206* (2013.01); *G11C 17/18* (2013.01)

(58) Field of Classification Search
CPC ......... G11C 17/16; G11C 17/14; G11C 17/08; H01L 23/5252; H01L 27/1026; H01L 27/11206

USPC ............................ 365/96, 100, 225.7, 225.6
See application file for complete search history.

(56) References Cited

U.S. PATENT DOCUMENTS

| | | | | | |
|---|---|---|---|---|---|
| 3,976,983 | A | * | 8/1976 | Moussie ................ | G11C 17/16 365/103 |
| 4,125,880 | A | * | 11/1978 | Taylor .................... | G11C 17/08 365/242 |
| 4,382,289 | A | * | 5/1983 | Saitoh .................... | G11C 17/14 257/529 |
| 4,424,578 | A | * | 1/1984 | Miyamoto ............. | G11C 17/16 257/529 |
| 4,428,066 | A | * | 1/1984 | Kihara ................... | G11C 17/14 257/529 |
| 4,605,872 | A | * | 8/1986 | Rung .................... | G11C 29/785 257/137 |
| 4,658,253 | A | * | 4/1987 | Johnson ............. | H03K 19/1772 326/44 |
| 5,661,323 | A | * | 8/1997 | Choi .................... | H01L 23/5256 257/378 |
| 5,859,562 | A | * | 1/1999 | McCollum ............. | G11C 17/16 327/525 |

(Continued)

FOREIGN PATENT DOCUMENTS

WO       2010002585 A1    1/2010

OTHER PUBLICATIONS

Office Action, in the German language, from counterpart German Application No. 102016115939.5, dated Apr. 20, 2017, 9 pp.

*Primary Examiner* — Tan T. Nguyen
(74) *Attorney, Agent, or Firm* — Shumaker & Sieffert, P.A.

(57) ABSTRACT

Memory cells and corresponding memory arrays are provided. The memory cell comprises a fusable element and a bipolar transistor arranged adjacent to the fusable element.

14 Claims, 6 Drawing Sheets

(56) References Cited

U.S. PATENT DOCUMENTS

| | | | |
|---|---|---|---|
| 7,804,701 B2* | 9/2010 | Hoefler | G11C 17/16 365/185.18 |
| 9,230,813 B2 | 1/2016 | Luan | |
| 9,406,397 B1 | 8/2016 | Ju | |
| 2003/0218487 A1 | 11/2003 | Madurawe | |
| 2006/0255385 A1 | 11/2006 | Schoellkopf | |
| 2011/0267915 A1* | 11/2011 | Son | G11C 17/16 365/225.7 |
| 2013/0077381 A1* | 3/2013 | Kwon | G11C 5/02 365/148 |
| 2013/0114343 A1* | 5/2013 | Chiu | G11C 16/10 365/185.18 |
| 2014/0293673 A1* | 10/2014 | Wu | G11C 17/16 365/96 |
| 2016/0181260 A1* | 6/2016 | Lee | H01L 27/11206 365/96 |
| 2017/0005036 A1* | 1/2017 | Kodama | H01L 21/82 |

* cited by examiner

ONE TIME PROGRAMMABLE MEMORY CELL AND MEMORY ARRAY

TECHNICAL FIELD

The present application relates to one time programmable (OTP) memory cells, to memory arrays comprising such memory cells and to corresponding methods.

BACKGROUND

One time programmable memory cells and corresponding memory arrays provide non-volatile memory which may be programmed once with desired values to be stored, which values then remain stored also without power being supplied. Sometimes, such one time programmable memories are also referred to as programmable read only memories ("PROM"). Such memories use configurations where elements like fuses or anti-fuses are arranged in an array and accessible by wordlines and bitlines. Fuses or anti-fuses may be irreversibly modified by applying a programming voltage, for example through breakdown of an oxide, thus programming the memory. Reading the memory then generally occurs using lower voltages than the programming voltage.

Such memories are for example used in telecommunication applications, sensor applications, in read-out circuits, e.g. application specific integrated circuits (ASICs) for microelectromechanical systems (MEMS) or in radio frequency switches, but are not limited to these applications. Non-volatile memories may for example be used for storing calibration data from a post-manufacturing calibration or to store software code needed for a particular device.

Increasingly, there is a demand for higher storage densities of such memories, i.e. a higher number of memory cells per area. Furthermore, it is desirable that production of such memories be compatible with standard manufacturing techniques, for example CMOS process compatible. Finally, high reliability of such memories is desired.

SUMMARY

A memory cell as defined in claim 1 or 10 is provided. The dependent claims define further embodiments, a memory array comprising such memory cells and a method for programming such a memory array.

According to an embodiment, a memory cell is provided, comprising:
a fusable element, and
a bipolar transistor arranged adjacent to the fusable element.

According to another embodiment, a memory cell is provided, comprising:
a substrate of a first polarity,
a region of a second polarity formed in the substrate,
a first region of the first polarity and a second region of the first polarity formed in the region of the second polarity, the first and second regions of the first polarity being separated by a first distance,
an oxide film formed on the region of the second polarity and separated from the first region of the first polarity by a second distance,
a first contact region formed on the oxide, and
a second contact region formed on the first region of the first polarity.

According to a further embodiment, a memory array is provided, comprising:
a grid of wordlines and bitlines, and
a plurality of memory cells as described above, each of the plurality of memory cells being associated with a respective pair of a wordline of the wordlines and a bitline of the bitlines.

According to another embodiment, a method for programming such a memory array is provided.

The above summary is merely intended to give a brief overview over some implementations and is not to be construed as limiting. In particular, other implementations may comprise other features than the ones discussed above.

DETAILED DESCRIPTION

In the following, various embodiments will be described in detail referring to the attached drawings. These embodiments are provided by way of example only and are not to be construed as limiting. For example, while embodiments may be shown and described as comprising a plurality of features or elements, in other embodiments some of these features or elements may be omitted, and/or replaced by alternative features or elements. Moreover, in addition to the features and elements explicitly shown and described, further features or elements, for example features or elements conventionally used in one time programmable memories like fuse or anti-fuse based memories may be provided.

Features from different embodiments may be combined to form further embodiments unless noted otherwise. Furthermore, variations or modifications described with respect to one of the embodiments may also be applied to other embodiments.

A fuse element, as used herein, is a component where by applying a programming voltage and/or current an electrical connection is irreversibly separated, corresponding to behavior of conventional fuses used in buildings, where a high current leads to an interruption of an electrical connection. An anti-fuse element, in contrast thereto, is an element where by applying programming current and/or voltage an electrical isolation like an oxide film is weakened and/or at least partially destroyed, thus establishing an electrical connection. The term "fusable element" will be used herein to refer both to fuse elements and anti-fuse elements.

Generally, as commonly used in the art, + signs after p or n indicate higher p- or n-type doping concentrations, and ++ signs indicate even higher concentrations, like degenerate doping to provide electrical contact regions.

Figure 1:
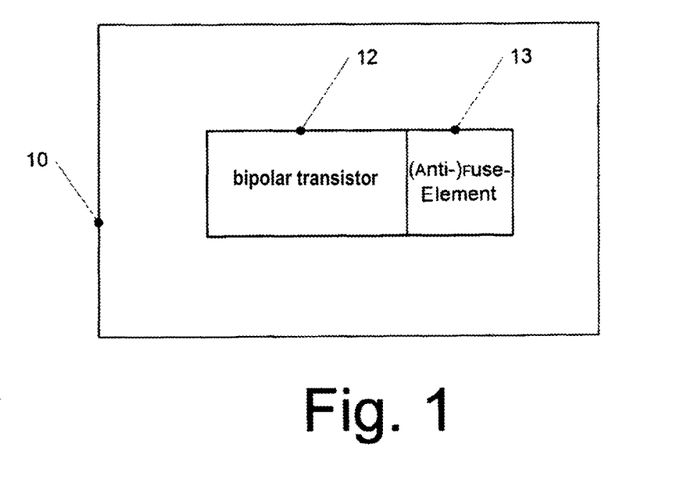
FIG. 1 is a block diagram of a memory cell according to an embodiment.

Turning now to the figures, FIG. 1 illustrates a one time programmable memory cell 10 according to an embodiment. Memory cell 10 comprises a fusable element 13, i.e. fuse or anti-fuse element. In embodiments, fusable element 13 is an anti-fuse element which comprises an oxide film which is partially destroyed or weakened by applying a programming voltage pulse.

Adjacent to element 13, a bipolar transistor 12, i.e. an npn transistor or a pnp transistor, is provided, which is used inter alia for reading and/or programming memory cell 10. In particular, a first electrical connection may be provided to element 13, and a second electrical connection may be provided to bipolar transistor 12, and for reading a voltage may be applied between the first and second connection. Depending on a state of element 13 (programmed or unprogrammed) a current flowing in response to the voltage may vary.

In some embodiments, for reading memory cell 10 bipolar transistor 12 may be open, i.e. essentially non-conducting between collector and emitter terminals thereof. Furthermore, in some embodiments, where a plurality of cells 10 are arranged in a memory array, transistors of cells not being read or at least some transistors like transistors of adjacent cells adjacent of a cell to be read to be opened may be closed, i.e. essentially conducting between collector and emitter terminals. Providing a bipolar transistor in some embodiments may lead to lower leakage currents than for example providing only a simple diode.

Figure 2:
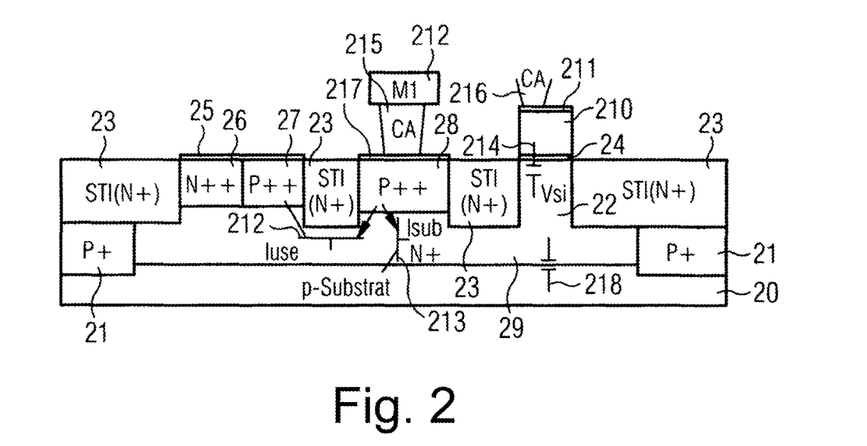
FIG. 2 is a cross-sectional view of a memory cell according to an embodiment.
Figure 3:
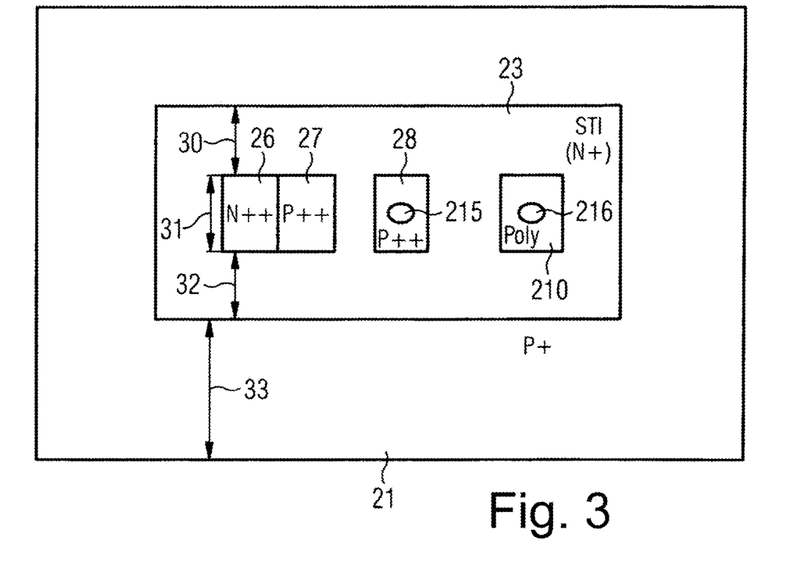
FIG. 3 is an example top view of the memory cell of FIG. 2.

FIGS. 2 and 3 illustrate a specific implementation of a memory cell according to an embodiment. While specific details and example dimensions are given in the embodiment of FIGS. 2 and 3, these are not to be construed as limiting, and dimensions and layers used may vary. Furthermore, while in the embodiment of FIGS. 2 and 3 specific polarities (p and n polarities) are shown, this is also not be construed as limiting.

FIG. 2 shows a cross-sectional view of the memory cell, and FIG. 3 illustrates a schematic plan view of the memory cell. In the embodiment of FIGS. 2 and 3 on a semiconductor substrate 20, which is p doped, for example a p doped silicon substrate (for example a silicon wafer or part thereof), an n+ region 29 is provided. In n+ region 29, highly p doped (p++) regions 27 and 28 are formed, which together with n+ region 29 form a pnp bipolar transistor, as symbolized by a graphic symbol 212 for a pnp transistor. Highly p doped region 28 forms an emitter, highly p doped region 27 forms a collector and n+ region 29 forms the base of this pnp transistor. A further pnp transistor is formed by highly p doped region 28, plus region 29 and p substrate 20, as symbolized by a graphic symbol 213. Such doped regions are also referred to as wells.

Furthermore, adjacent to highly p doped region 27, a highly n doped (n++) region 26 is provided. Regions 29, 27, 28 are separated by a shallow trench isolation (STI) generally labeled 23. Shallow trench isolation 23 may include or be formed as a n+ doped region. Surrounding shallow trench isolation 23, a p+ ring 21 is provided.

Bridging highly n doped region 26 and highly p doped region 27, a cobalt silicide (CoSi) film 25 is provided as an example for an electrically conducting layer. Other electrically conducting layers may also be used, e.g. metal films. Highly p doped region 27 and highly n doped region 26 bridged with electrically conducting layer 25 provide a kind of "carrier conversion" from minority carriers to majority carriers in region 29, which reduces leakage to substrate. A further electrically conducting layer 217, for example made of CoSi, is provided on highly p doped region 28. In other embodiments, layer 217 may be omitted, and contacting may be made e.g. via a polysilicon layer.

Furthermore, a thin oxide film 24 is provided at least on a part 22 of n+ region 29. While in the representation of FIG. 2 oxide layer 24 also covers part of the shallow trench isolation 23, in other embodiments, the oxide may cover only part 22 of n+ region 29 embedded between shallow trench isolation 23. Oxide film 24 may for example be a silicon oxide film and may be comparatively thin, for example having a thickness of between 2 and 3 nm.

On top of oxide film 24, doped polysilicon 210 is provided followed by an electrically conducting layer 211, for example CoSi. Instead of CoSi, other conducting materials, for example metal layers, may be provided. Please note that in the top view of FIG. 3, the electrically conducting layers (25, 217, 211) are omitted.

Graphic symbol 214 denotes a capacitance between polysilicon 210 and n+ region 29 (in particular part 22 thereof), and a graphic symbol 218 denotes a capacitance between n+ region 29 and p substrate 20. Such a capacitance as capacitance 218 in general occurs at pn junctions like the pn junction formed by substrate 20 and n+ region 29.

Electrically conducting material 217 serves as a first contact area 215 via a metal layer 212, and electrically conducting material 211 serves as a second contact area 216. First and second contact areas 215, 216 may be used to access the memory cell of FIGS. 2 and 3. In some embodiments, contact area 215 may be coupled to a wordline, and contact area 216 may be coupled to a bitline, the operation of which will be explained later in more detail.

In some embodiments, as illustrated in FIG. 3, a width of regions 26, 27, 28 and of polysilicon 210 as indicated by an arrow 31 may be between 150 nm and 350 nm or between 200 and 300 nm, for example between 230 nm and 270 nm, for example about 250 nm, a width of the shallow trench isolation as indicated by arrows 30 and 32 may be between 200 nm and 400 nm or between 250 and 350 nm, for example about 300 nm (for each of arrows 30 and 32), and a width of p+ Ring 21 as indicated by an arrow 33 may be between 500 and 700 nm or between 550 nm and 650 nm, for example about 600 nm, although other values may apply. In a direction perpendicular to arrows 30-33, a width of regions 26 and 27 may be between 150 nm and 350 nm or between 200 nm and 300 nm, for example between 220 nm and 260 nm, for example about 240 nm each, a width of region 28 may be between 200 nm and 400 nm or between 250 nm and 350 nm, for example between 260 nm and 300 nm, for example about 280 nm, and a width of part 22 under polysilicon 210 may be between 300 nm and 700 nm or between 400 nm and 600 nm, for example between 450 nm and 550 nm, for example about 500 nm. Regions 27 and 28 may be separated by between 100 nm or 300 nm or between 150 nm and 250 nm, for example about 200 nm, and region 28 and part 22 may also be separated by between 100 nm or 300 nm or between 150 nm and 250 nm, for example about 200 nm. These numbers are merely given to give an impression of possible sizes of the shown memory cell and is not to be construed as limiting. In particular, in other embodiments other dimensions may be used.

The memory cell of FIGS. 2 and 3 may have a first state, where oxide 24 is intact, and a second state, where oxide 24 has been weakened and/or partially destroyed by applying a programming voltage. The first state will also be referred to as unprogrammed state herein, and the second state will be referred to as programmed state. The first state may represent one of a logic 0 or a logic 1, and the second state may represent the other one of a logic 0 or a logic 1.

Next, programming the memory cell, i.e. bringing the cell from the unprogrammed state to the programmed state, will be discussed referring to FIGS. 4-8.

Figure 4:
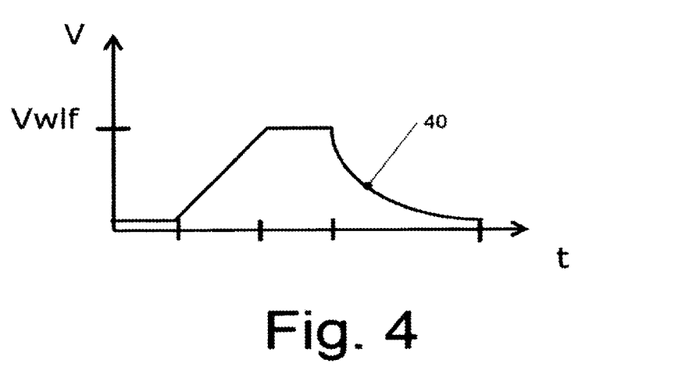
FIGS. 4 and 5 are example signals in the memory cell of FIG. 2.
Figure 5:
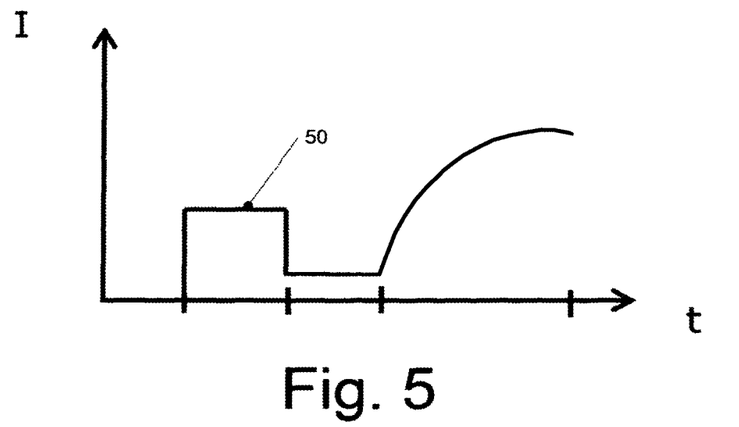

For programming the cell, a voltage exceeding a programming threshold is applied between contact areas 215 and 216, for example a pulse of about 8 V. This voltage has to be such to exceed a threshold for oxide 24. A curve 40 of FIG. 4 illustrates the voltage across oxide 24 for such a programming pulse, and a curve 50 of FIG. 5 illustrates the current flowing through the oxide over time.

When starting the pulse, the voltage rises, and a current flows until the capacitors 214 and 218 are charged. Then, the voltage remains constant, while the current drops to a value close to 0 corresponding to leakage current through the (intact) oxide 24. Then, through breakdown effects, the oxide breaks down, leading to a large increase of current flow according to curve 50 of FIG. 5 and a decrease of the voltage according to curve 40 of FIG. 4, as the resistance formed by oxide 24 strongly decreases and therefore also the voltage drop across the oxide decreases while the current increases.

This breakdown of oxide 24 is irreversible, such that after applying the programming pulse the cell remains in the programmed state.

Figure 6:
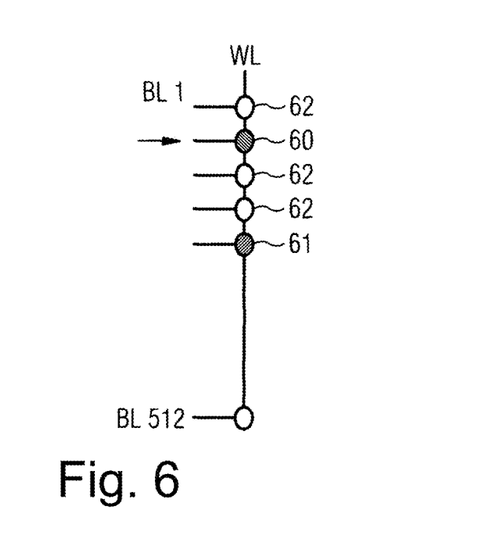
FIGS. 6-8 are diagrams illustrating programming of memory cells according to embodiments.
Figure 7:
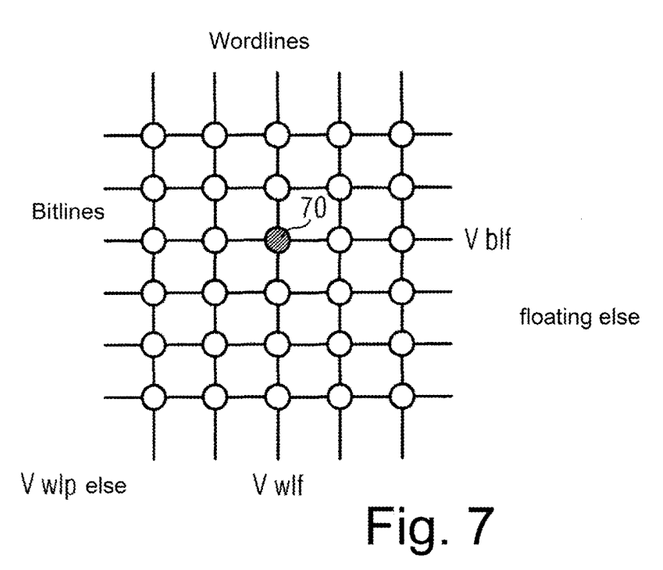
Figure 8:
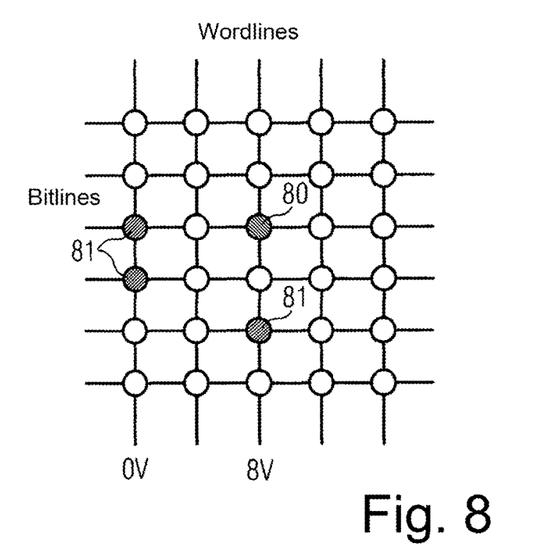

FIGS. 6-8 illustrate programming in case a plurality of memory cells like the cell illustrated in FIGS. 2 and 3 are provided in a memory array. As usual for memories, the array is connected by a plurality of wordlines (WL) and bitlines (BL). In the embodiments of FIGS. 6-8, wordlines are coupled to respective contact areas 215 of the cells, and bitlines are coupled to respective contact areas 216 of the cells. The cells are represented by dots at crossings between bitlines and wordlines. In FIG. 6, for illustration a single wordline is shown, on which a plurality of cells 60, 61, 62 are provided, for example 512 cells addressable by 512 bitlines BL1-BL512. In the example of FIG. 6, a cell 62 is to be programmed, a cell 61 is already in a programmed state and cells 62 are in an unprogrammed state. For programming cell 60, in an embodiment a positive programming voltage is applied to the wordline (for example 8 V), and a reference voltage, for example 0 V, is applied to the respective bitline of cell 60. The bitlines of the remaining cells are left floating.

FIG. 7 illustrates the situation for a two-dimensional array of cells, where a cell 70 is to be programmed. To the wordline coupled to cell 70, a programming voltage Vwlf, for example 8 V, is applied, and to the bitline coupled to cell 70 a corresponding bitline programming voltage Vblf, for example 0 V, is applied. Other bitlines are left floating, and to other wordlines a protection voltage Vwlp is applied, for example 0 V. The floating bitlines serve to suppress leakage current by already programmed but not selected cells and protects non-selected cells. Furthermore, the voltage Vwlp being set to 0 V (the same as Vblf in this example) serves to protect unprogrammed cells on the same bitline as cell 70, as this ensures that no large voltage drop occurs over the oxide of these unprogrammed cells.

FIG. 8 illustrates a similar situation as FIG. 7, where a cell 80 is to be programmed, and cells 81 are already programmed. In FIG. 8, voltages of 0 V are used for Vwlp and Vblf, and a voltage of 8 V is used as an example for Vwlf. It should be noted that these voltages may differ depending on the implementation.

For the selected cell 80, a current caused by the applied voltage flows in the forward direction via the pn junction formed by the highly doped p region and n+ region 29 and therefore is essentially fully applied over oxide 28, thus programming it.

For unprogrammed cells on the selected wordline of cell 80, as the bitline is floating no oxide damage occurs for the pulse length of the programming pulse (as e.g. shown in FIGS. 4 and 5).

For a programmed cell like cell 81 on the selected wordline, 8 V is applied to the wordline and the bitline is floating, which may lead to a low current flow, which, however, does not disturb the programming.

For a programmed cell 81 on a selected bitline, i.e. the bitline through cell 80, both wordline and bitline have 0 V applied, and therefore the pnp transistor 212 is open, i.e. no current may flow (0 V applied to base and emitter). Finally, programmed cell 81 on different wordlines and bitlines have a wordline voltage (at region 28, i.e. the emitter) of 0 V, even higher bitline voltage for example up to 8 V would lead to a reversed biasing and no current flow. By designing the width of the shallow trench isolations 23 accordingly, it may be ensured that no breakdown occurs at such voltages.

Next, reading of memory cells will be discussed referring to FIGS. 9-11.

Figure 9:
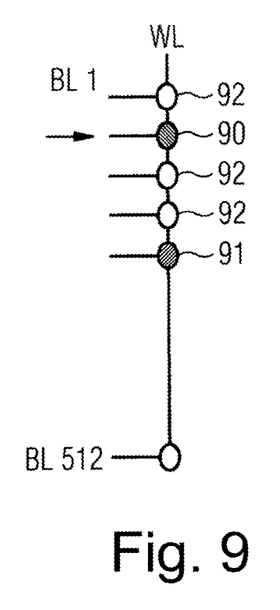
FIGS. 9-11 are diagrams illustrating reading of memory cells according to embodiments.

FIG. 9 illustrates a representation similar to the representation of FIG. 6 with a single wordline and a plurality of, for example 512, bitlines. Cell 90 is to be read, a cell 91 is a programmed cell on the same wordline as cell 90 and cells 92 are unprogrammed cells on the same wordline. For reading, a voltage lower than the programming voltage, for example 1.2 V, is applied to the wordline, and a reference voltage like 0 V is applied to all bitlines. The current flowing between the wordline and the bitline coupled to cell 90 depends on the state of cell 90, i.e. programmed or unprogrammed. In particular, the current is higher for programmed cells. In this way, programmed cells may be distinguished from unprogrammed cells, and the value stored in the cell may be read.

Figure 10:
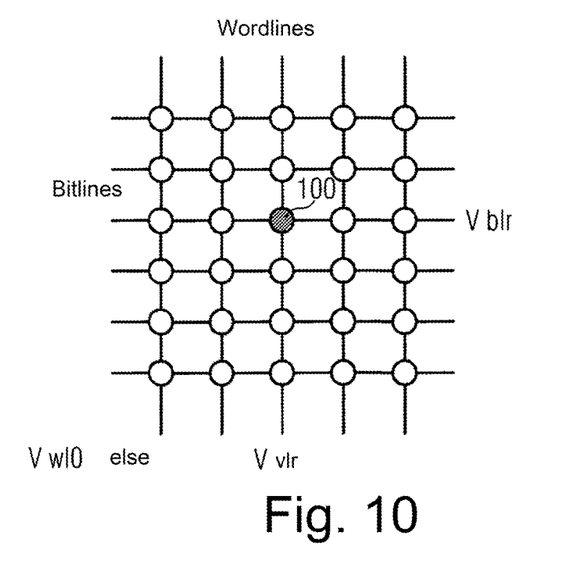
Figure 11:
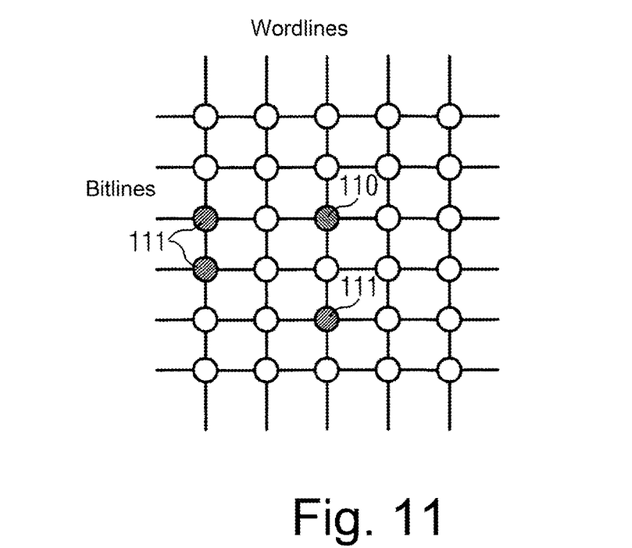

FIG. 10 illustrates a two-dimensional array of memory cells, with a cell 100 to be read, similar to the representation of FIG. 7. For reading, a bitline read voltage Vblr, for example 0 V, is applied to all bitlines. To the wordline coupled to cell 100, a wordline read voltage Vwlr is applied, for example 1.2 V, whereas an initial wordline voltage Vwl0, for example 0 V, is applied to the remaining wordlines. This configuration enables reading of cell 100 and suppresses disturbances from non-selected cells, i.e. cells other than cell 100.

This will be explained in more detail referring to FIG. 11, which shows a representation similar to FIG. 8, with a cell 110 selected for reading, 111 denoting programmed cells and the remaining cells being unprogrammed. To give a numerical example, for reading cell 110 a voltage of 1.2 V is applied to the wordline coupled to cell 110, and a voltage of 0 V is applied to the remaining wordlines and to all bitlines.

For cell 110, this biases the pn junction between highly p doped region 28 and n+ region 29 in forward direction, such that a current may flow. For a programmed cell, the isolation provided by oxide 24 is reduced or removed, such a higher current flows than in case of an unprogrammed cell.

For a programmed cell 111 on the same bitline as cell 110, wordline and bitline voltage are both 0 V, such that no current flows. The same applies to an unprogrammed cell on the same bitline.

A programmed cell on the same wordline provides some leakage current, as it is also biased in the forward direction.

Therefore, as shown above with the cell discussed with reference to FIGS. 1-3 memory arrays may be built which may be programmed and read as explained above.

At least some embodiments are defined by the examples given below:

EXAMPLE 1

A memory cell, comprising:
a fusable element, and
a bipolar transistor arranged adjacent to the fusable element.

EXAMPLE 2

The memory cell of example 1, wherein the fusable element comprises an anti-fuse element.

EXAMPLE 3

The device of example 2, wherein the anti-fuse element comprises an oxide film.

EXAMPLE 4

The device of example 3, wherein a thickness of the oxide film is between 2 nm and 3 nm.

EXAMPLE 5

The device of example 1, wherein the bipolar transistor comprises a pnp transistor.

EXAMPLE 6

The device of example 5, wherein a first p doped region of the pnp transistor is provided adjacent to the fusable element and separated from the fusable element by an isolation region.

EXAMPLE 7

The memory cell of example 6, wherein the isolation region comprises a shallow trench isolation.

EXAMPLE 8

The device of example 6, wherein a second p doped region of the pnp transistor is provided adjacent to an n doped region, wherein the second p doped region and the n doped region are coupled by an electrically conducting layer.

EXAMPLE 9

The device of example 1, wherein the bipolar transistor is coupled to a wordline terminal of the memory cell, and the fusable element is coupled to a bitline terminal of the memory cell.

EXAMPLE 10

A memory cell, comprising:
a substrate of a first polarity,
a region of a second polarity formed in the substrate,
a first region of the first polarity and a second region of the first polarity formed in the region of the second polarity, the first and second regions of the first polarity being separated by a first distance,
an oxide film formed on the region of the second polarity and separated from the first region of the first polarity by a second distance,
a first contact region formed on the oxide, and
a second contact region formed on the first region of the first polarity.

EXAMPLE 11

The memory cell of example 10, comprising a first isolation region between the first and second regions of the first polarity, and a second isolation region between the first region of the first polarity and the oxide.

EXAMPLE 12

The memory cell of example 10, wherein the first contact region comprises a polycrystalline semiconductor on the oxide and an electrically conducting layer on the polycrystalline semiconductor material.

EXAMPLE 13

The memory cell of example 10, wherein the first contact region is a bitline contact, and the second contact region is a wordline contact.

EXAMPLE 14

The memory cell of example 1, further comprising a further region of the second polarity adjacent to the second region of the first polarity, the further region of the second having a higher dopant concentration than the region of the second polarity, and an electrically conducting layer bridging the second region of the first polarity and the further region of the second polarity.

EXAMPLE 15

The memory cell of example 1, further comprising a p-doped ring region surrounding the region of the second polarity.

EXAMPLE 16

The memory cell of example 10, wherein the first polarity is a p polarity, and the second polarity is an n polarity.

EXAMPLE 17

A memory array, comprising:
a grid of wordlines and bitlines, and
a plurality of memory cells of example 1, each of the plurality of memory cells being associated with a respective pair of a wordline of the wordlines and a bitline of the bitlines.

EXAMPLE 18

A method for programming the memory arrangement of example 17, comprising, for programming a selected memory cell of the plurality of memory cells:
setting a voltage on the wordline associated with the selected memory cell to a first voltage,
setting a voltage on the bitline associated with the selected memory cell to a second voltage lower than the first voltage,
setting a voltage on wordlines not associated with the selected memory cell to a third voltage, and leaving bitlines not associated with the selected memory cells floating.

EXAMPLE 19

The method of example 18, wherein the third voltage is equal to the first voltage.

EXAMPLE 20

The method of example 18, wherein the second and third voltages are 0 V, and the first voltage is at least 8 V.

As can be seen from the above discussions of variations and modifications, the above-described embodiments are not to be construed as limiting, but serve merely as non-limiting examples.

The invention claimed is:

1. A memory cell, comprising:
a fusable element, and
a bipolar transistor arranged adjacent to the fusable element and electrically connected to the fusable element, wherein the bipolar transistor comprises a pnp transistor,
wherein a first p doped region of the pnp transistor is provided adjacent to the fusable element and separated from the fusable element by an isolation region, and
wherein a second p doped region of the pnp transistor is provided adjacent to an n doped region, wherein the second p doped region and the n doped region are coupled by an electrically conducting layer.

2. The memory cell of claim 1, wherein the fusable element comprises an anti-fuse element.

3. The memory cell of claim 2, wherein the anti-fuse element comprises an oxide film.

4. The memory cell of claim 3, wherein a thickness of the oxide film is between 2 nm and 3 nm.

5. The memory cell of claim 1, wherein the isolation region comprises a shallow trench isolation.

6. The memory cell of claim 1, wherein the bipolar transistor is coupled to a wordline terminal of the memory cell, and the fusable element is coupled to a bitline terminal of the memory cell.

7. A memory cell, comprising:
a substrate of a first polarity,
a region of a second polarity formed in the substrate,
a first region of the first polarity and a second region of the first polarity formed in the region of the second polarity, the first and second regions of the first polarity being separated by a first distance,
an oxide film formed on the region of the second polarity and separated from the first region of the first polarity by a second distance,
a first contact region formed on the oxide film, and
a second contact region formed on the first region of the first polarity.

8. The memory cell of claim 7, comprising a first isolation region between the first and second regions of the first polarity, and a second isolation region between the first region of the first polarity and the oxide.

9. The memory cell of claim 7 wherein the first contact region comprises a polycrystalline semiconductor on the oxide and an electrically conducting layer on the polycrystalline semiconductor material.

10. The memory cell of claim 7, wherein the first contact region is a bitline contact, and the second contact region is a wordline contact.

11. The memory cell of claim 7, further comprising a further region of the second polarity adjacent to the second region of the first polarity, the further region of the second polarity having a higher dopant concentration than the region of the second polarity, and an electrically conducting layer bridging the second region of the first polarity and the further region of the second polarity.

12. The memory cell of claim 7, further comprising a p doped ring region surrounding the region of the second polarity.

13. The memory cell of claim 7, wherein the first polarity is a p polarity, and the second polarity is an n polarity.

14. A memory array, comprising:
a grid of wordlines and bitlines, and
a plurality of memory cells, each of the plurality of memory cells being associated with a respective wordline of the wordlines and a bitline of the bitlines, wherein each of the memory cells comprises a fusable element, and a bipolar transistor arranged adjacent to the fusable element, and electrically connected to the fusable element,
wherein the bipolar transistor comprises a pnp transistor;
wherein a first p doped region of the pnp transistor is provided adjacent to the fusable element and separated from the fusable element by an isolation region, and
wherein a second p doped region of the pnp transistor is provided adjacent to an n doped region, wherein the second p doped region and the n doped region are coupled by an electrically conducting layer.

* * * * *